United States Patent
Shan et al.

(10) Patent No.: US 8,885,305 B2
(45) Date of Patent: Nov. 11, 2014

(54) METHOD AND APPARATUS FOR ESD CIRCUITS

(75) Inventors: Yi Shan, Singapore (SG); Manjunatha Prabhu, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 178 days.

(21) Appl. No.: 13/455,819

(22) Filed: Apr. 25, 2012

(65) Prior Publication Data
US 2013/0286520 A1    Oct. 31, 2013

(51) Int. Cl.
H02H 9/02    (2006.01)
H05K 3/30    (2006.01)

(52) U.S. Cl.
USPC ............................................. 361/57; 361/56

(58) Field of Classification Search
USPC .................................................. 361/56, 57
See application file for complete search history.

(56) References Cited

U.S. PATENT DOCUMENTS

| | | | | |
|---|---|---|---|---|
| 4,039,857 A | * | 8/1977 | Ahmed | 326/127 |
| 4,051,391 A | * | 9/1977 | Ahmed | 379/306 |
| 5,574,618 A | * | 11/1996 | Croft | 361/212 |
| 7,589,944 B2 | * | 9/2009 | Mergens et al. | 361/56 |
| 2002/0154463 A1 | * | 10/2002 | Mergens et al. | 361/56 |
| 2009/0086387 A1 | * | 4/2009 | Engel | 361/42 |
| 2013/0057992 A1 | * | 3/2013 | Altolaguirre et al. | 361/56 |
| 2013/0163129 A1 | * | 6/2013 | Lai et al. | 361/56 |

* cited by examiner

Primary Examiner — Rexford Barnie
Assistant Examiner — Angela Brooks
(74) Attorney, Agent, or Firm — Ditthavong & Steiner, P.C.

(57) ABSTRACT

A high performance ESD protection circuit is provided. Embodiments include a circuit having an RC clamp circuit including a first NMOS transistor having a first source, drain, and gate, a current mirror circuit including first and second PMOS transistors having a second and third source, drain, and gate, respectively, and an SCR circuit including a first P+ contact. The first source is coupled to a ground rail, the first drain is coupled to the second drain, second gate, and third gate, the second and third sources are coupled to a power rail, and the third drain is coupled to the first P+ contact, wherein during an ESD event the first NMOS and PMOS transistors turn on to discharge a first current to the ground rail, and the current mirror provides a second current to the first P+ contact for turning on the SCR.

20 Claims, 7 Drawing Sheets

METHOD AND APPARATUS FOR ESD CIRCUITS

TECHNICAL FIELD

The present disclosure relates to electrostatic discharge (ESD) circuits. The present disclosure is particularly applicable to ESD circuits utilized in input/output (I/O) driver circuits.

BACKGROUND

Generally, circuit devices for protection against an ESD event are utilized in many electronic circuit designs to discharge high voltages and high currents due to the ESD event at a device and to prevent damage to other internal circuitry of the device.

FIG. 1A schematically illustrates a traditional silicon-controlled rectifier (SCR) 100 circuitry utilized in an ESD protection circuit design, and graph 150 in FIG. 1B depicts a transmission-line-pulse (TLP) test result showing a current (e.g., ampere, I) vs. voltage (I-V) curve characterizing the ESD performance associated with the SCR circuit 100. Usually, the SCR 100 ESD circuitry can provide a high ESD protection performance while requiring a small layout area in an integrated-circuit (IC) design. However, as indicated in the graph 150, the SCR 100 circuitry requires a high trigger voltage (Vt1) 151 before it can be enabled to provide an adequate ESD protection to other circuits in a device and prevent any damages due to an ESD event. Moreover, as indicated in the graph 150, levels of a trigger current (It1) 153, a holding current (Ih) 155, and a holding voltage (Vh) 157 are low, which can cause performance issues such as latch-up (e.g., a parasitic low impedance path between a power supply's power rails, which can stay on and conduct large amounts of current) in different areas of circuitry affected by an ESD event.

FIG. 2 schematically illustrates another ESD circuit 200, which includes utilization of metal-oxide-semiconductor field-effect transistors (MOSFETs). In this example, the ESD circuit 200 is an NMOS (n-type MOSFET) based resistor-capacitor (RC) clamp including resistor 205 (R), capacitor 207 (C), NMOS transistor 203, NMOS transistors 209 and PMOS transistors 211. Further, with selection of proper values for R and C, a suitable RC time constant (e.g., R×C=time required to electrically charge the capacitor, via the resistor, to a certain percentage of the capacitor's full capacity) can provide for a lower trigger voltage (e.g., Vt1) and a quicker turn-on time so that the circuit 200 can quickly turn on and effectively protect other circuits in a device from being destroyed by an ESD event. Additionally, the RC-clamp provides for a lower latch-up risk wherein any possible latch-up current may easily be discharged while preventing formation of other latch-up paths. However, the NMOS based RC-clamp in the circuit 200 would require a very large layout area (e.g., a large NMOS 203) in order to discharge an ESD current and would not be efficient (e.g., cost effective) for implementation in an integrated circuit design in order to provide an ESD protection level as high as the SCR circuit 100.

A need therefore exists for a well performing and cost effective ESD solution and enabling methodology.

SUMMARY

An aspect of the present disclosure is an ESD protection circuit utilizing a current mirror and SCR circuit having high ESD performance including a low voltage trigger, a fast turn on, and low latch-up risk.

Another aspect of the present disclosure is a method for implementing an ESD protection circuit utilizing a current mirror and SCR circuit having high ESD performance including a low voltage trigger, a fast turn on, and low latch-up risk.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: an RC clamp circuit including a first NMOS transistor having a first source, a first drain, and a first gate; a current mirror circuit including a first PMOS transistor having a second source, a second drain, and a second gate, and a second PMOS transistor having a third source, a third drain, and a third gate; and an SCR circuit including a first P+ contact, wherein the first source is coupled to a ground rail, the first drain is coupled to the second drain, to the second gate, and to the third gate, the second source is coupled to a power rail, the third source is coupled to the power rail, and the third drain is coupled to the first P+ contact, wherein during an ESD event the first NMOS transistor and the first PMOS transistor turn on to discharge a first current to the ground rail, and wherein the current mirror is utilized to provide a second current to the first P+ contact for turning on the SCR. Some aspects further include a circuit where a current ratio of the first current to the second current travelling through the second PMOS transistor is proportional to a size ratio of the first PMOS transistor to the second PMOS transistor.

Further aspects include the RC clamp circuit having a first resistor having a first terminal and a second terminal; and a first capacitor having a third terminal and a fourth terminal, wherein the first terminal is coupled to the power rail, the second terminal is coupled to the third terminal, and the fourth terminal is coupled to the ground rail.

Other aspects include the RC clamp circuit having a second NMOS transistor having a fourth source, a fourth drain, and a fourth gate; and a third PMOS transistor having a fifth source, a fifth drain, and a fifth gate, wherein the fourth source is coupled to the ground rail, the fifth source is coupled to the power rail, the fourth drain is coupled to the fifth drain, the fourth gate and the fifth gate are coupled to the second terminal.

Another aspect includes the RC clamp circuit having a third NMOS transistor having a sixth source, a sixth drain, and a sixth gate; and a fourth PMOS transistor having an seventh source, an seventh drain, and an seventh gate, wherein the sixth source is coupled to the ground rail, the seventh source is coupled to the power rail, the sixth drain is coupled to the seventh drain, the sixth gate and the seventh gate are coupled to the fourth drain.

An additional aspect includes the RC clamp circuit having a fourth NMOS transistor having a eighth source, an eighth drain, and an eighth gate; and a fifth PMOS transistor having a ninth source, a ninth drain, and a ninth gate, wherein the eight source is coupled to the ground rail, the ninth source is coupled to the power rail, the eighth drain is coupled to the ninth drain and to the first gate, the eighth gate and the ninth gate are coupled to the sixth drain.

Further aspects include the SCR circuit having an N-well region including a first N+ contact and a second P+ contact; a second resistor having a fifth terminal and a sixth terminal; and a PNP transistor having a first emitter, a first collector, and a first base, wherein the first N+ contact and the second P+ contact are coupled to the power rail, and wherein the fifth terminal is coupled to the first N+ contact, the sixth terminal is coupled to the first base, and wherein the first emitter is coupled to the second P+ contact.

In an additional aspect the SCR circuit includes a P-well region which includes a second N+ contact and a third P+ contact; a third resistor having a seventh terminal and a eighth terminal; and an NPN transistor having a second emitter, a second collector, and a second base, wherein the second N+ contact and the third P+ contact are coupled to the ground rail, and wherein the seventh terminal is coupled to the third P+ contact, and wherein the eighth terminal is coupled to the second base, to the first P+ contact, and to the first collector, and wherein the second emitter is coupled to the second N+ and second collector is connected to the first base.

In one aspect the SCR circuit includes an input/output (I/O) pad; and a diode having an anode terminal and a cathode terminal, wherein the anode terminal is coupled to the I/O pad, to the first N+ contact and to the second P+ contact, and wherein the cathode terminal is coupled to the power rail.

In another aspect a circuit includes a resistor capacitor (RC) clamp circuit including a first PMOS transistor having a first source, a first drain, and a first gate; a silicon controlled rectifier (SCR) circuit including a first N+ contact; and a current mirror circuit including a first NMOS transistor having a second source, a second drain, a second gate, and a second NMOS transistor having a third source, a third drain, and a third gate, wherein the first source is coupled to a power rail, the first drain is coupled to the second drain, the second gate, and the third gate, the second source is coupled to a ground rail, the third source is coupled to the ground rail, and the third drain is coupled to the first N+ contact, and wherein during an ESD event the first NMOS transistor and the first PMOS transistor turn on to discharge a first current to the ground rail, and wherein the current mirror is utilized to provide a second current to the SCR for turning on the SCR. Aspects include a circuit wherein a current ratio of the first current to the second current travelling through the second NMOS transistor is proportional to a size ratio of the first NMOS transistor to the second NMOS transistor.

In one aspect the RC clamp circuit includes a first resistor having a first terminal and a second terminal; and a first capacitor having a third terminal and a fourth terminal, wherein the first terminal is coupled to the power rail, the second terminal is coupled to the third terminal, and the fourth terminal is coupled to the ground rail.

An additional aspect includes the RC clamp circuit having a second PMOS transistor having a fourth source, a fourth drain, and a fourth gate; and a third NMOS transistor having a fifth source, a fifth drain, and a fifth gate, wherein the fourth source is coupled to the power rail, the fourth drain is coupled to the fifth drain, the fourth gate and the fifth gate are coupled to the second terminal, and the fifth source is coupled to the ground rail.

In a further aspect the RC clamp circuit includes a third PMOS transistor having a sixth source, a sixth drain, and a sixth gate; and a fourth NMOS transistor having an seventh source, a seventh drain, and a seventh gate, wherein the sixth source is coupled to the power rail, the sixth drain is coupled to the seventh drain and to the first gate, the sixth gate is coupled to the seventh gate and to the fourth drain, and the seventh source is coupled to the ground rail.

Another aspect includes the SCR circuit having an N-well region including, a first P+ contact and a second N+ contact; a second resistor having a fifth terminal and a sixth terminal; and a PNP transistor having a first emitter, a first collector, and a first base, wherein the first P+ contact and the second N+ contact are coupled to the power rail, and wherein the fifth terminal is coupled to the second N+ contact, the sixth terminal is coupled to the first base and first N+ contact, and wherein the first emitter is coupled to the first P+ contact.

In a further aspect, the SCR circuit includes a P-well region including, a second P+ contact and a third N+ contact; a third resistor having a seventh terminal and a eighth terminal; and an NPN transistor having a second emitter, a second collector, and a second base, wherein the second P+ contact and the third N+ contact are coupled to the ground rail, and wherein the seventh terminal is coupled to the second P+ contact, the eighth terminal is coupled to the second base and to the first collector, and wherein the second emitter is coupled to the third N+ contact, and the second collector is connected to the first base.

Another aspect includes the SCR circuit having an input/output (I/O) pad; and a diode having an anode terminal and a cathode terminal, wherein the anode terminal is coupled to the I/O pad, to the first P+ contact and to the second N+ contact, and the cathode terminal is coupled to the power rail.

An additional aspect of the present disclosure is a method including: providing a resistor capacitor (RC) clamp circuit including a first NMOS transistor having a first source, a first drain, and a first gate; providing a current mirror circuit including a first PMOS transistor having a second source, a second drain, a second gate, and a second PMOS transistor having a third source, a third drain, and a third gate; providing a silicon controlled rectifier (SCR) circuit including a first P+ contact, a second P+ contact and a first N+ contact; coupling the first source to a ground rail, coupling the first drain to the second drain, the second gate, and the third gate, the second source is coupled to a power rail, the third source is coupled to the power rail, and the third drain is coupled to the first P+ contact, wherein during an ESD event the first NMOS transistor and the first PMOS transistor turn on to discharge a first current to the ground rail; and providing a second current to the first P+ contact for turning on the SCR.

In one aspect a current ratio of the first current to the second current travelling through the second PMOS transistor is proportional to a size ratio of the first PMOS transistor to the second PMOS transistor.

Another aspect of the present disclosure includes providing an input/output (I/O) pad; providing a diode having an anode terminal and a cathode terminal; and coupling the anode terminal is coupled to the I/O pad, to the first N+ contact and to the second P+ contact, and wherein the cathode terminal is coupled to the power rail.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

Figure 1A:
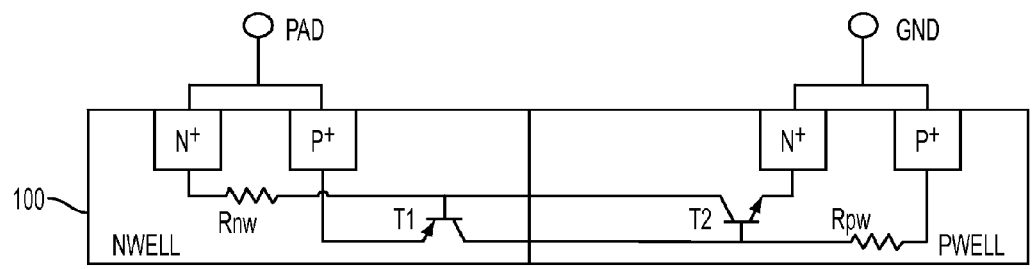
FIG. 1A schematically illustrates a traditional SCR circuitry utilized in an ESD protection circuit design, and FIG.
Figure 1B:
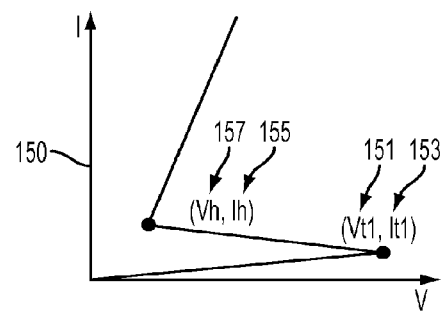
Figure 2:
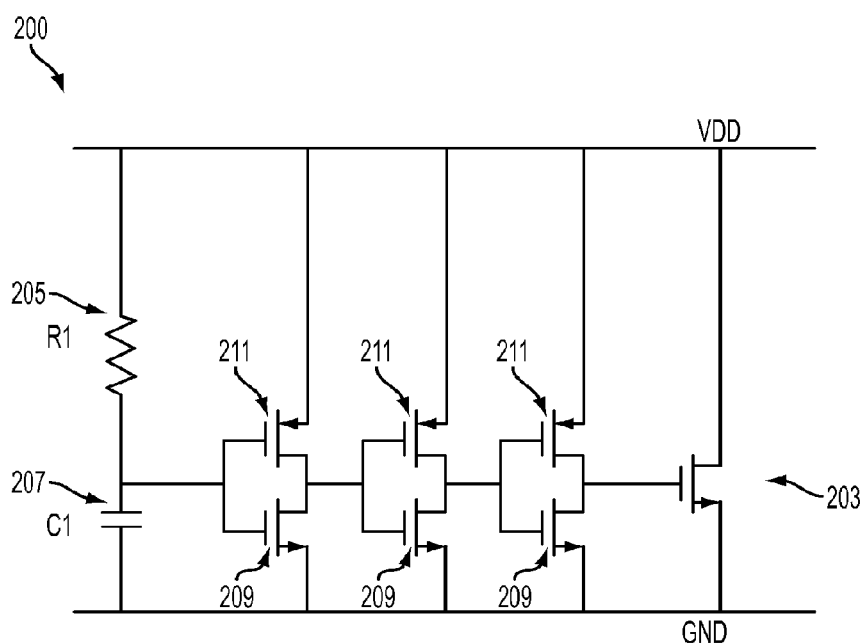
Figure 5:
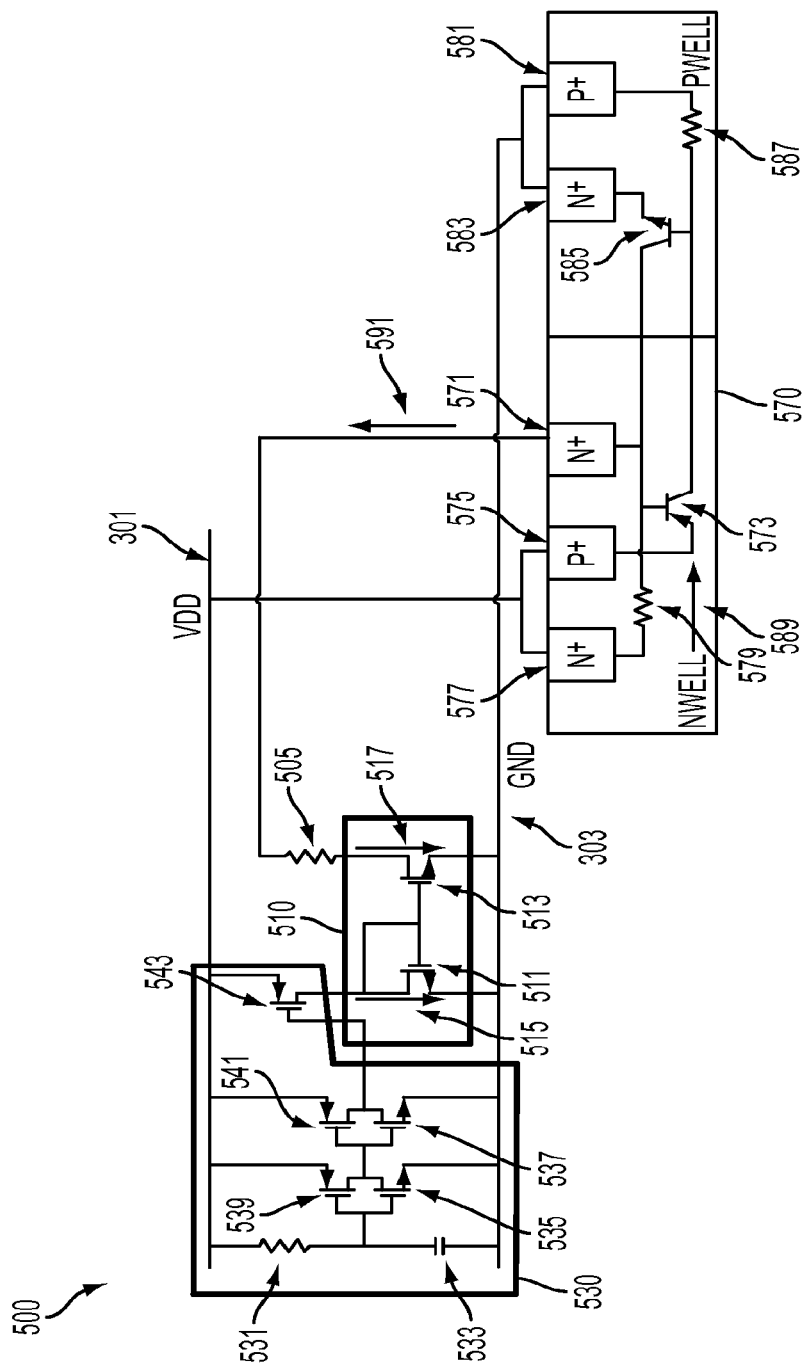
Figure 6:
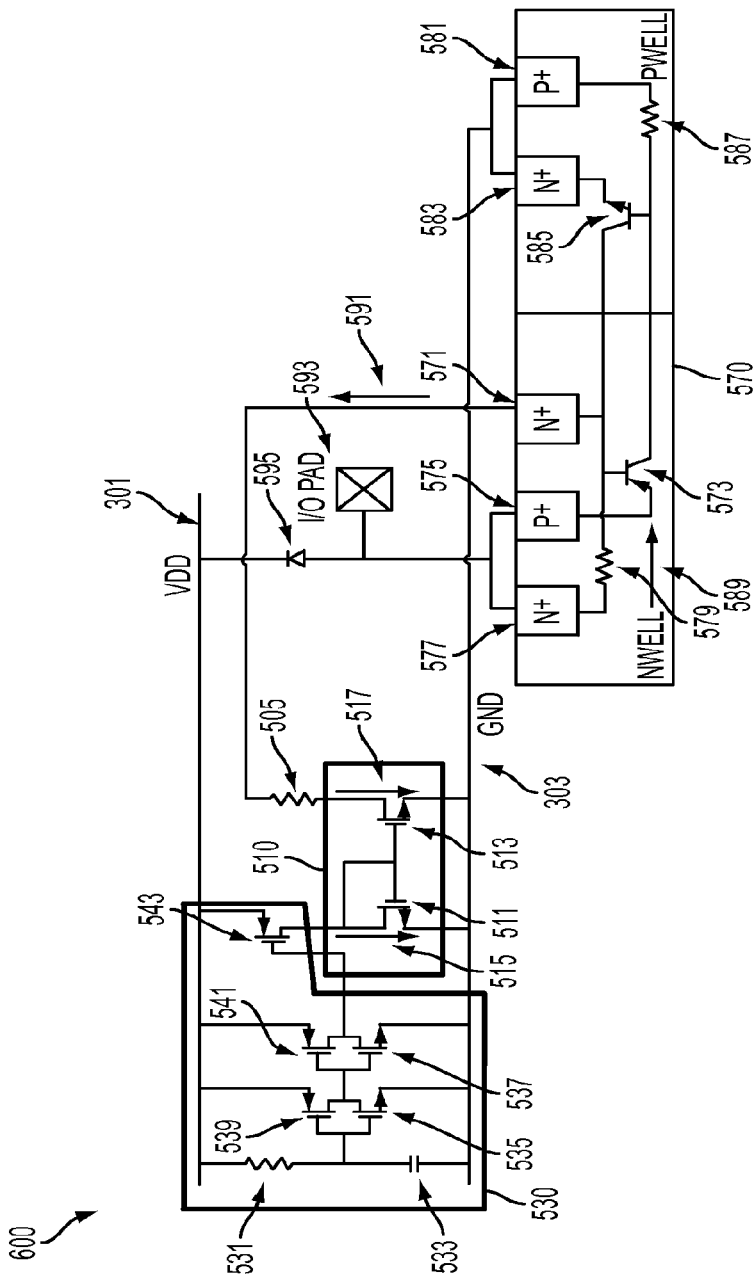
Figure 7:
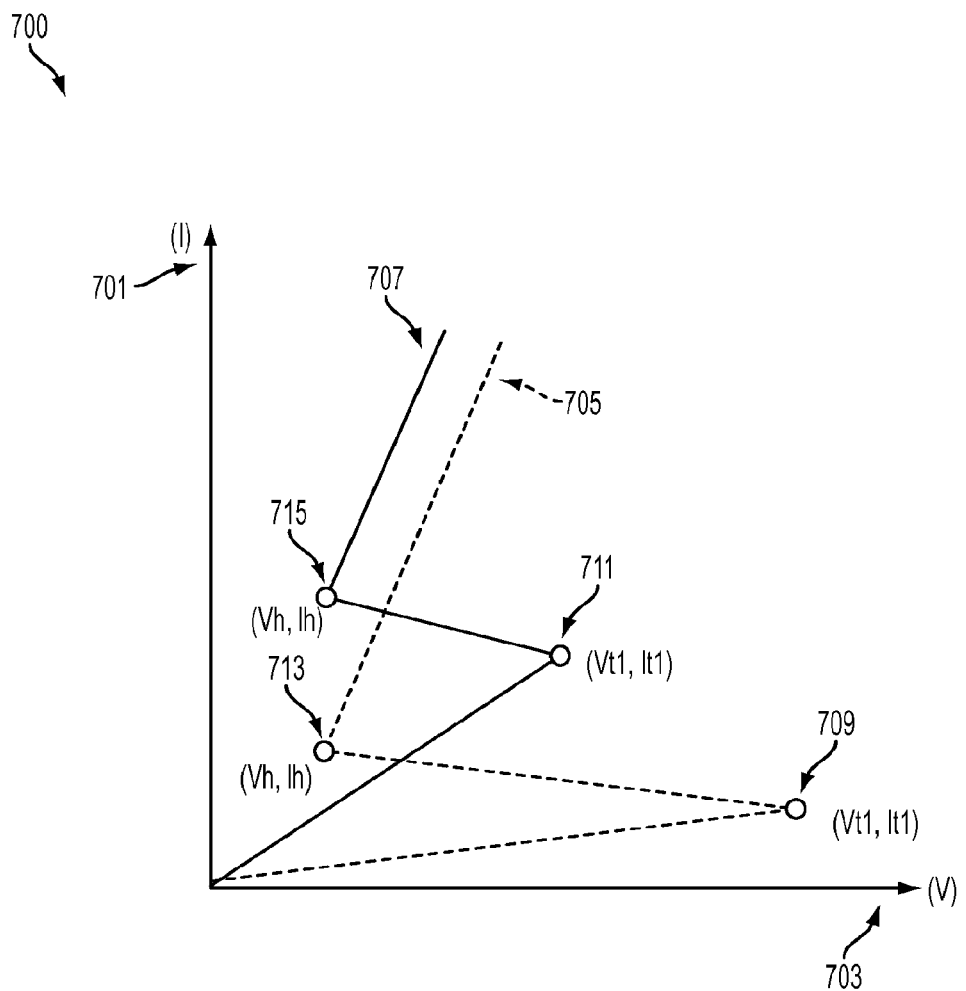

1B shows a graph depicting a TLP test result showing an I-V curve characterizing the ESD performance associated with the SCR circuit of FIG. 1A;

FIG. 2 schematically illustrates an NMOS based RC clamp circuit utilized in an ESD protection circuit design;

FIGS. 3 through 6 schematically illustrate various ESD protection circuit designs each utilizing a current mirror and an SCR circuit, in accordance with exemplary embodiments of the present disclosure; and FIG. 7 is graph showing I-V curves of TLP test results characterizing ESD performances associated with different ESD protection circuits.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of high trigger voltage, slow turn on speed, and high latch-up risk attendant upon ESD event/zapping, for instance, from an I/O pad to a ground rail in an IC device. The present disclosure addresses and solves such problems, for instance, by, inter alia, utilizing a current mirror circuit to provide a trigger current to an SCR circuit for discharging excessive current in the device due to an ESD event.

FIGS. 3 through 6 schematically illustrate various ESD protection circuits each utilizing a current mirror and SCR circuit, in accordance with exemplary embodiments of the present disclosure.

Figure 3:
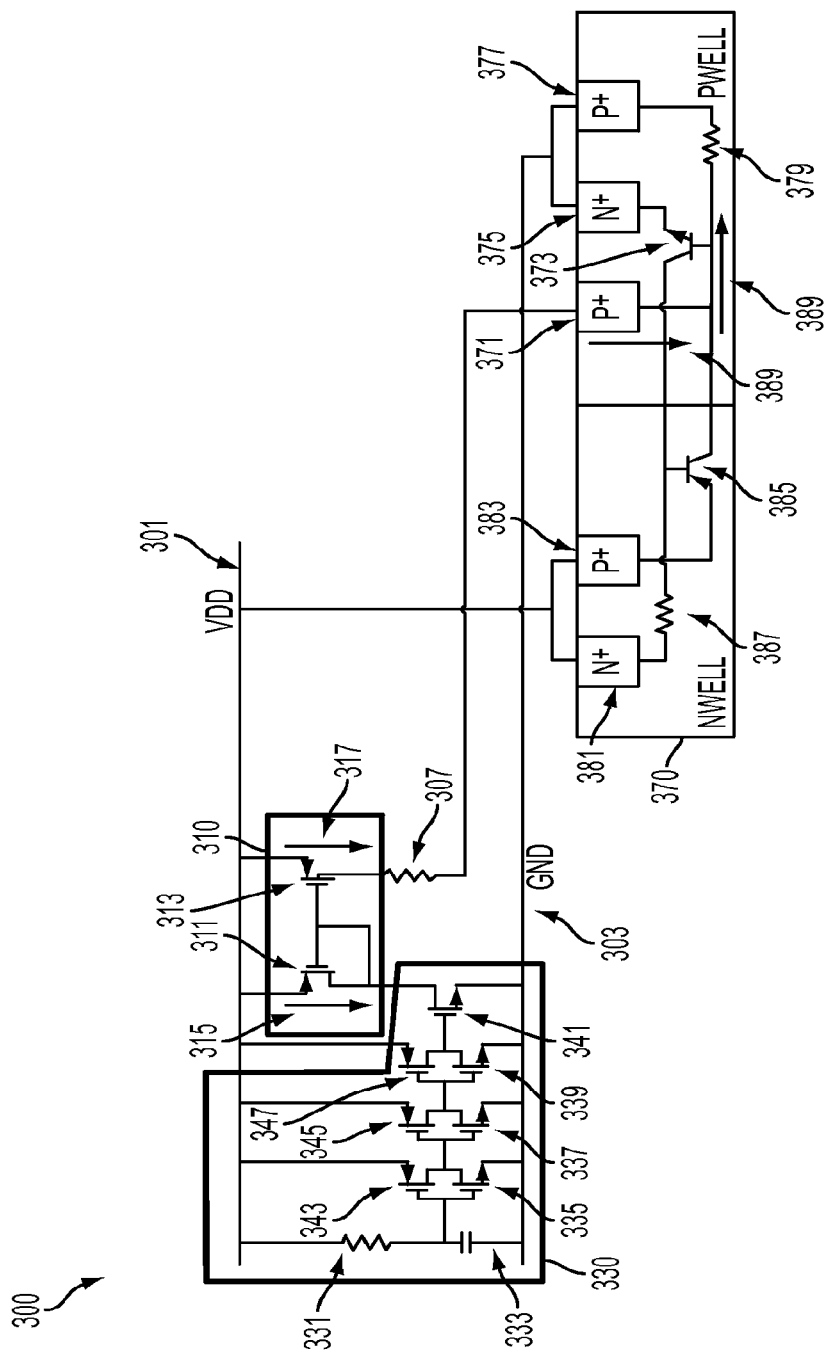

FIG. 3 schematically illustrates circuit 300 including a current mirror circuit 310, an RC clamp circuit 330, and an SCR circuit 370, all electrically coupled. The RC clamp circuit 330 includes resistor 331, capacitor 333, NMOS transistors 335, 337, 339, 341, and PMOS transistors 343, 345, and 347. The SCR circuit 370 includes a PWELL and an NWELL region where the PWELL region includes P+ contact 371, NPN transistor 373, N+ contact 375, P+ contact 377, and equivalent resistance 379 (e.g. parasitic resistance Rpw). Additionally, the NWELL region includes N+ contact 381, P+ contact 383, PNP transistor 385 and equivalent resistance 387 (e.g., parasitic resistance Rnw). The current mirror circuit 310 includes PMOS 311 and PMOS 313 transistors with the PMOS transistor 311 including a source coupled to power rail 301 (e.g., VDD), and a drain and a gate coupled to a drain of NMOS transistor 341 of the RC clamp 330. Further, the PMOS transistor 313 includes a source coupled to the power rail 301, a gate coupled to the gate of the PMOS transistor 311, and a drain coupled to P+ contact 371 of the SCR circuit 370. The current mirror circuit 310 is utilized to control and provide a second current 317 (e.g., trigger current, I2) to the SCR circuit 370. For example, during an ESD event (e.g., ESD zapping) the NMOS transistor 341 and the PMOS transistor 311 turn on to conduct (e.g., discharge) a first current 315 (e.g., ESD current, I1). The PMOS transistor 313 also turns on during the ESD event to conduct and provide the second current 317 to the SCR circuit 370 so that the SCR circuit 370 can turn on for discharging a major portion of the ESD current and for avoiding damage to other components in a device utilizing the circuit 300. Since a ratio of the first current to the second current is proportional to a size ratio of the PMOS transistor 311 to the PMOS transistor 313, by controlling the first current 315, a proper second current 317 is provided, via the P+ contact 371, to increase the base voltage potential of NPN transistor 373 and cause the SCR circuit 370 to turn on. However, if the resistance 379 is too high (e.g., about 500 ohm), a small amount of the first current 315 discharged, via PMOS transistor 311 and NMOS transistor 341, will cause a corresponding second current 317 and current 389 in the SCR, which in turn will cause too early of an increase in the base voltage potential at the NPN transistor 373, which can cause the SCR circuit 370 to trigger too early. In this case, resistor 307 may be included to control the second current 317 so to control the level and timing of the base voltage potential increase at the NPN transistor 373.

Figure 4:
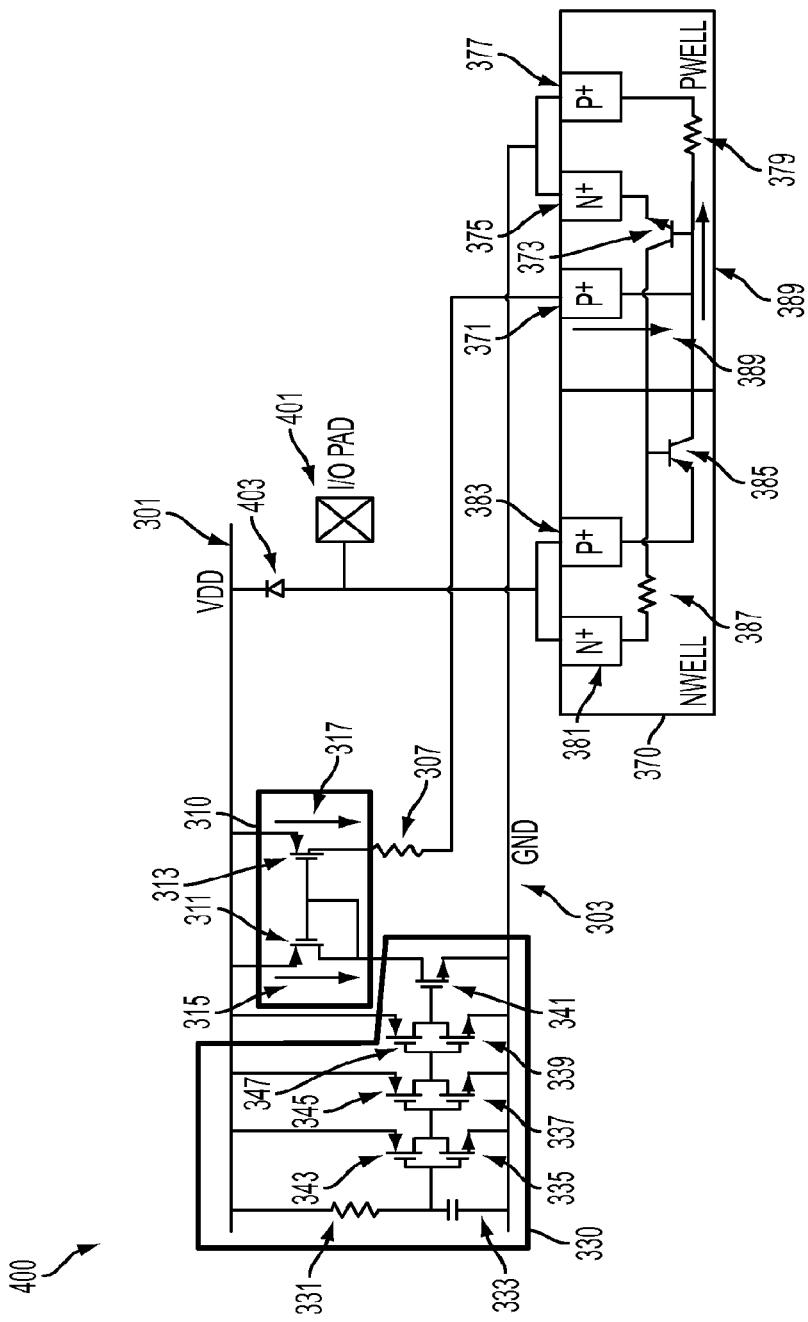

FIG. 4 illustrates circuit 400 including an input/output (I/O) interface pad, in accordance with an exemplary embodiment of the present disclosure. As shown, the circuit 400 includes the circuit 300 of FIG. 3 to provide ESD protection when an I/O interface pad is utilized. Diode 403 has a cathode terminal coupled to P+ contact 383, to N+ contact 381, and to I/O pad 401, and an anode terminal coupled to the power rail 301. The I/O pad 401 may also be coupled to one or more input and/or output terminals.

Advantages of the embodiment of FIGS. 3 through 6 include that the MOSFET transistors 311, 341, 511 and 543 do not need to be too large, because after the SCR turns on, the SCR can handle most of the ESD current. Therefore, to obtain the same ESD protection level, the layout size can be smaller than the normal RC-clamp in the prior art. Further, snapback will happen only after the SCR is turned on. Therefore, in the I-V curve, It1 and Ih will be much higher than the traditional SCR structure, while Vt1 is much lower. Accordingly, during an ESD condition, the turn on speed can be quicker. During a latch-up condition, the latch-up current can easily be discharged without triggering the SCR structure, thereby rendering the latch-up risk lower.

FIG. 5 illustrates another exemplary embodiment, including a current mirror circuit 510, an RC clamp circuit 530, and an SCR circuit 570, with the circuits being electrically coupled. The RC clamp circuit 530 includes resistor 531, capacitor 533, NMOS transistors 535, 537, and PMOS transistors 539, 541, and 543. The SCR circuit 570 includes an NWELL and a PWELL region where the NWELL region includes N+ contact 571, PNP transistor 573, P+ contact 575, N+ contact 577, and equivalent resistance 579 (e.g. parasitic resistance Rnw). Additionally, the PWELL region includes P+ contact 581, N+ contact 583, NPN transistor 585 and equivalent resistance 587 (e.g., parasitic resistance Rnw). The current mirror circuit 510 includes NMOS 511 and NMOS 513 transistors with the NMOS transistor 511 including a source coupled to ground rail 303 (e.g., GND) and a drain and a gate coupled to a drain of PMOS transistor 543 of the RC clamp 530. Further, NMOS transistor 513 includes a source coupled to the ground rail 303, a gate coupled to the gate of NMOS transistor 511, and a drain coupled to N+ contact 571 of the SCR circuit 570. The current mirror circuit 510 is utilized to control and provide a second current 517 (e.g., trigger current, I2) to the SCR circuit 570. For example, during an ESD event (e.g., ESD zapping) the PMOS transistor 543 and the NMOS transistor 511 turn on to conduct (e.g., discharge) a first current 515 (e.g., ESD current, I1) due to the ESD event. In addition, the NMOS transistor 513 also turns on to conduct and provide the second current 517 to the SCR circuit 570 so that the SCR circuit 570 can turn on for discharging a majority of the ESD current and for avoiding damage to other components in a device utilizing the circuit 500. A ratio of the first current to the second current is proportional to size ratio of the NMOS transistor 511 to the NMOS transistor 513. Therefore, by controlling the first current 515, a proper second current 517 is provided to the SCR circuit 570, via the N+ contact 571, to reduce the base voltage potential of PNP transistor 573 and cause the SCR circuit 570 to turn on. Similar to the embodiment of FIG. 3, if the equivalent resistance 579 (e.g., parasitic resistance Rnw) is too high (e.g. about 500 ohm), a small amount of the first current 515 discharged, via NMOS transistor 511 and PMOS transistor 543, will cause a corresponding second current 517 and current 589 in the SCR circuit 570, which will cause too early of a reduction in the base voltage potential at the PNP transistor 573, which can cause the SCR circuit 570 to trigger too early. In this case, resistor 505 may be included to control the second current 517 so to control the level and timing of the base voltage potential reduction at the PNP transistor 573.

FIG. 6 illustrates circuit 600 including an input/output (I/O) interface pad, in accordance with an exemplary embodiment of the present disclosure. As shown, the circuit 600 includes the circuit 500 of the FIG. 5 to provide ESD protection when an I/O interface pad is utilized. Diode 595 is included having a cathode terminal coupled to P+ contact 575, to N+ contact 577, and to I/O pad 593 and an anode terminal coupled to the power rail 301. The I/O pad 593 may be coupled to one or more input and/or output terminals.

FIG. 7 is a graph 700 showing current 701 vs. voltage 703 (I-V) curves of transmission-line-pulse (TLP) test results characterizing ESD performances associated with different ESD protection circuits. In the graph 700, curve 705 is associated with ESD performance of a traditional SCR circuit 100 and curve 707 is associated with ESD protection circuit 300 according to the present disclosure. As indicated by curve 705, the traditional SCR circuit 100 requires a high trigger voltage (Vt1) at data point 709 before it can be enabled to provide an adequate ESD protection to other circuits in a device and prevent any damages due to an ESD event. In contrast, the circuit 300 requires a lower trigger voltage (Vt1) as shown in data point 711, which could provide earlier ESD protection. Moreover, the graph 700 also shows a lower level of trigger current (It1) at 709 for the traditional SCR circuit 100 compared to the higher level of the trigger current (It1) at data point 711 for the circuit 300. Additionally, a holding current (Ih) for the traditional SCR circuit at 713 is lower than the holding current (Ih) at 715 for the circuit 300, which can cause performance issues such as latch-up (e.g., a parasitic low impedance path between a power supply's power rails, which can stay on and conduct large amounts of current) in different areas of circuitry affected by an ESD event.

The embodiments of the present disclosure can achieve several technical effects, including ESD robustness and smaller circuit layout area in an IC device. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any other devices utilizing logic or high-voltage technology nodes. The present disclosure therefore enjoys industrial applicability in any of various types of highly integrated semiconductor devices, including devices that use ESD protection devices to pass ESD/Latch-up standards specifications (e.g., liquid crystal display (LCD) drivers, synchronous random access memories (SRAM), One Time Programming (OTP), power management products, etc.).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
a resistor capacitor (RC) clamp circuit including a first NMOS transistor having a first source, a first drain, and a first gate;
a current mirror circuit including a first PMOS transistor having a second source, a second drain, and a second gate, and a second PMOS transistor having a third source, a third drain, and a third gate; and
a silicon controlled rectifier (SCR) circuit including a first P+ contact,
wherein the first source is coupled to a ground rail, the first drain is coupled to the second drain, to the second gate, and to the third gate, the second source is coupled to a power rail, the third source is coupled to the power rail, and the third drain is coupled to the first P+ contact,
wherein during an ESD event the first NMOS transistor and the first PMOS transistor turn on to discharge a first current to the ground rail, and
wherein the current mirror is utilized to provide a second current to the first P+ contact for turning on the SCR.

2. The circuit according to claim 1, wherein a current ratio of the first current to the second current travelling through the second PMOS transistor is proportional to a size ratio of the first PMOS transistor to the second PMOS transistor.

3. The circuit according to claim 1, wherein the RC clamp circuit further comprises:
a first resistor having a first terminal and a second terminal; and
a first capacitor having a third terminal and a fourth terminal, wherein the first terminal is coupled to the power rail, the second terminal is coupled to the third terminal, and the fourth terminal is coupled to the ground rail.

4. The circuit according to claim 1, wherein the RC clamp circuit further comprises:
a second NMOS transistor having a fourth source, a fourth drain, and a fourth gate; and
a third PMOS transistor having a fifth source, a fifth drain, and a fifth gate,
wherein the fourth source is coupled to the ground rail, the fifth source is coupled to the power rail, the fourth drain is coupled to the fifth drain, the fourth gate and the fifth gate are coupled to the second terminal.

5. The circuit according to claim 1, wherein the RC clamp circuit further comprises:
a third NMOS transistor having a sixth source, a sixth drain, and a sixth gate; and
a fourth PMOS transistor having a seventh source, a seventh drain, and a seventh gate,
wherein the sixth source is coupled to the ground rail, the seventh source is coupled to the power rail, the sixth drain is coupled to the seventh drain, the sixth gate and the seventh gate are coupled to the fourth drain.

6. The circuit according to claim 1, wherein the RC clamp circuit further comprises:
   a fourth NMOS transistor having an eighth source, an eighth drain, and an eighth gate; and
   a fifth PMOS transistor having a ninth source, a ninth drain, and a ninth gate,
   wherein the eighth source is coupled to the ground rail, the ninth source is coupled to the power rail, the eighth drain is coupled to the ninth drain and to the first gate, the eighth gate and the ninth gate are coupled to the sixth drain.

7. The circuit according to claim 1, wherein the SCR circuit further comprises:
   an N-well region including,
   a first N+ contact and a second P+ contact;
   a second resistor having a fifth terminal and a sixth terminal; and
   a PNP transistor having a first emitter, a first collector, and a first base,
   wherein the first N+ contact and the second P+ contact are coupled to the power rail, and wherein the fifth terminal is coupled to the first N+ contact, the sixth terminal is coupled to the first base, and wherein the first emitter is coupled to the second P+ contact.

8. The circuit according to claim 1, wherein the SCR circuit further comprises:
   a P-well region including,
   a second N+ contact and a third P+ contact;
   a third resistor having a seventh terminal and an eighth terminal; and
   an NPN transistor having a second emitter, a second collector, and a second base,
   wherein the second N+ contact and the third P+ contact are coupled to the ground rail, and
   wherein the seventh terminal is coupled to the third P+ contact, and
   wherein the eighth terminal is coupled to the second base, to the first P+ contact, and to the first collector, and
   wherein the second emitter is coupled to the second N+ contact and second collector is connected to the first base.

9. The circuit according to claim 7, further comprising:
   an input/output (I/O) pad; and
   a diode having an anode terminal and a cathode terminal,
   wherein the anode terminal is coupled to the I/O pad, to the first N+ contact and to the second P+ contact, and wherein the cathode terminal is coupled to the power rail.

10. A circuit comprising:
    a resistor capacitor (RC) clamp circuit including a first PMOS transistor having a first source, a first drain, and a first gate;
    a silicon controlled rectifier (SCR) circuit including a first N+ contact; and
    a current mirror circuit including a first NMOS transistor having a second source, a second drain, a second gate, and a second NMOS transistor having a third source, a third drain, and a third gate,
    wherein the first source is coupled to a power rail, the first drain is coupled to the second drain, the second gate, and the third gate, the second source is coupled to a ground rail, the third source is coupled to the ground rail, and the third drain is coupled to the first N+ contact, and
    wherein during an ESD event the first NMOS transistor and the first PMOS transistor turn on to discharge a first current to the ground rail, and
    wherein the current mirror is utilized to provide a second current to the SCR for turning on the SCR.

11. The circuit according to claim 10, wherein a current ratio of the first current to the second current travelling through the second NMOS transistor is proportional to a size ratio of the first NMOS transistor to the second NMOS transistor.

12. The circuit according to claim 10, wherein the RC clamp circuit further comprises:
    a first resistor having a first terminal and a second terminal; and
    a first capacitor having a third terminal and a fourth terminal,
    wherein the first terminal is coupled to the power rail, the second terminal is coupled to the third terminal, and the fourth terminal is coupled to the ground rail.

13. The circuit according to claim 10, wherein the RC clamp circuit further comprises:
    a second PMOS transistor having a fourth source, a fourth drain, and a fourth gate; and
    a third NMOS transistor having a fifth source, a fifth drain, and a fifth gate,
    wherein the fourth source is coupled to the power rail, the fourth drain is coupled to the fifth drain, the fourth gate and the fifth gate are coupled to the second terminal, and the fifth source is coupled to the ground rail.

14. The circuit according to claim 10, wherein the RC clamp circuit further comprises:
    a third PMOS transistor having a sixth source, a sixth drain, and a sixth gate; and
    a fourth NMOS transistor having a seventh source, a seventh drain, and a seventh gate,
    wherein the sixth source is coupled to the power rail, the sixth drain is coupled to the seventh drain and to the first gate, the sixth gate is coupled to the seventh gate and to the fourth drain, and the seventh source is coupled to the ground rail.

15. The circuit according to claim 10, wherein the SCR circuit further comprises:
    an N-well region including,
    a first P+ contact and a second N+ contact;
    a second resistor having a fifth terminal and a sixth terminal; and
    a PNP transistor having a first emitter, a first collector, and a first base,
    wherein the first P+ contact and the second N+ contact are coupled to the power rail, and
    wherein the fifth terminal is coupled to the second N+ contact, the sixth terminal is coupled to the first base and the first N+ contact, and
    wherein the first emitter is coupled to the first P+ contact.

16. The circuit according to claim 10, wherein the SCR circuit further comprises:
    a P-well region including,
    a second P+ contact and a third N+ contact;
    a third resistor having a seventh terminal and an eighth terminal; and
    an NPN transistor having a second emitter, a second collector, and a second base,
    wherein the second P+ contact and the third N+ contact are coupled to the ground rail, and
    wherein the seventh terminal is coupled to the second P+ contact, the eighth terminal is coupled to the second base and to the first collector, and
    wherein the second emitter is coupled to the third N+ contact and the second collector is connected to the first base.

17. The circuit according to claim 15, further comprising:
an input/output (I/O) pad; and
a diode having an anode terminal and a cathode terminal, wherein the anode terminal is coupled to the I/O pad, to the first P+ contact and to the second N+ contact, and the cathode terminal is coupled to the power rail.

18. A method comprising:
providing a resistor capacitor (RC) clamp circuit including a first NMOS transistor having a first source, a first drain, and a first gate;
providing a current mirror circuit including a first PMOS transistor having a second source, a second drain, a second gate, and a second PMOS transistor having a third source, a third drain, and a third gate;
providing a silicon controlled rectifier (SCR) circuit including a first P+ contact, a second P+ contact and a first N+ contact;
coupling the first source to a ground rail, the first drain is coupled to the second drain, the second gate, and the third gate, the second source is coupled to a power rail, the third source is coupled to the power rail, and the third drain is coupled to the first P+ contact,
wherein during an ESD event the first NMOS transistor and the first PMOS transistor turn on to discharge a first current to the ground rail; and
providing a second current to the first P+ contact for turning on the SCR.

19. The method according to claim 18, wherein a current ratio of the first current to the second current travelling through the second PMOS transistor is proportional to a size ratio of the first PMOS transistor to the second PMOS transistor.

20. The method according to claim 18, further comprising:
providing an input/output (I/O) pad;
providing a diode having an anode terminal and a cathode terminal; and
coupling the anode terminal to the I/O pad, to the first N+ contact and to the second P+ contact, and wherein the cathode terminal is coupled to the power rail.

* * * * *